United States Patent [19]

Yamada

[11] Patent Number: 4,901,125
[45] Date of Patent: Feb. 13, 1990

[54] CHARGE COUPLED DEVICE CAPABLE OF EFFICIENTLY TRANSFERRING CHARGE

[75] Inventor: Tetsuo Yamada, Yokohama, Japan

[73] Assignee: Kabushiki Kaisha Toshiba, Kawasaki, Japan

[21] Appl. No.: 231,645

[22] Filed: Aug. 10, 1988

Related U.S. Application Data

[63] Continuation of Ser. No. 23,928, Mar. 9, 1987, abandoned, which is a continuation of Ser. No. 804,621, Dec. 5, 1985, abandoned.

[30] Foreign Application Priority Data

Dec. 6, 1984 [JP] Japan .................... 59-257933
Dec. 28, 1984 [JP] Japan .................... 59-276089

[51] Int. Cl.$^4$ ...................... H01L 29/78; G11C 19/28
[52] U.S. Cl. ........................................... 357/24; 377/58
[58] Field of Search ................. 357/24, 30; 377/57-63

[56] References Cited

U.S. PATENT DOCUMENTS

| | | | |
|---|---|---|---|
| 3,852,799 | 12/1974 | Walden | 357/24 M |
| 3,896,474 | 7/1975 | Amelio et al. | 357/24 M |
| 3,903,543 | 9/1975 | Smith | 357/24 |
| 3,971,003 | 7/1976 | Kosonocky | 357/24 LR |
| 3,983,573 | 9/1976 | Ishihara | 357/24 |
| 3,986,197 | 10/1976 | Ablassmeier | 357/24 M |
| 4,158,209 | 6/1979 | Levine | 357/24 LR |
| 4,206,371 | 8/1980 | Weimer | 357/24 R |
| 4,207,477 | 6/1980 | Esser | 357/24 M |
| 4,667,213 | 5/1987 | Kosonocky | 357/24 M |
| 4,809,048 | 2/1989 | Kimata et al. | 357/24 M |

FOREIGN PATENT DOCUMENTS

| | | |
|---|---|---|
| 58-161364 | 9/1983 | Japan . |
| 2065974 | 7/1981 | United Kingdom . |

OTHER PUBLICATIONS

Mohsen et al "The Effects of Bulk Traps on the Performance of Bulk Channel Charge-Coupled Devices" IEEE Trans. Electron Devices vol. ED-21 (11/74) pp. 701-712.

Primary Examiner—Gene M. Munson
Attorney, Agent, or Firm—Finnegan, Henderson, Farabow, Garrett and Dunner

[57] ABSTRACT

A charge coupled device includes a main transfer channel having an n-type region formed in the surface area of a p-type silicon substrate and a plurality of electrodes formed over and insulated from the transfer channel and arranged in the direction in which the transfer channel extends. The charge coupled device further includes an n$^+$-type sub-transfer channel formed in the n-type region with an impurity concentration higher than that of the n-type region.

8 Claims, 6 Drawing Sheets

CHARGE COUPLED DEVICE CAPABLE OF EFFICIENTLY TRANSFERRING CHARGE

This is a continuation of application Ser. No. 07/023,928 filed Mar. 3, 1987, now abandoned, which is turn was a continuation of application Ser. No. 06/804,621 filed Dec. 5, 1985, also abandoned.

BACKGROUND OF THE INVENTION

This invention relates to a charge coupled device and, in particular, a charge coupled device for reading signals from a solid-state image sensing device.

A charge coupled device as shown in FIGS. 1 and 2 is known in the art. FIG. 1 is a top view showing a conventional solid-state image sensing device and FIG. 2 is a cross-sectional view as taken along line I—I in FIG. 1. The device includes an n-type region 12 as a transfer channel and p+-type regions 14A, 14B as a channel stopper in the surface area of a p-type semiconductor substrate 10. The n-type region 12 is formed between the p+-type regions 14A and 14B. Regions 12, 14A and 14B are entirely covered with an insulating layer 18. The device includes electrodes 20A, 20B, ... on insulating layer 18 to control an electric field in the transfer channel. The electrodes 20A, 20B, ... extend in a direction perpendicular to that in which the transfer channel extends. The electrodes 20A, 20B, ... are selectively connected to terminals $\phi 1, \ldots, \phi 4$ where control voltages are received at a predetermined phase difference. That is, electrodes 20A and 20E are connected to terminal $\phi 1$ and electrodes 20B and 20F are connected to terminal $\phi 2$. Electrodes 20C and 20G are connected to terminal $\phi 3$ and electrodes 20D, 20H are connected to terminal $\phi 4$. When electrodes 20A, 20B, ... receive the corresponding control voltages sequentially, an electric charge in the transfer channel is transferred in the direction indicated by arrow A in FIG. 1.

FIG. 3 shows potential distribution in n-type region 12 and p+-type regions 14A and 14B. When the control voltage is supplied to, for example, electrode 20D, potential 22 in the n-type region 12 is structurally set at a level lower than potentials 24A and 24B (i.e., a substrate potential level) in p+-type regions 14A and 14B. The charge is transferred from the portion in n-type region 12 situated below electrode 20C to the portion in n-type region 12 situated below electrode, 2D. Potential 22 in the region falls to level 22A as shown in FIG. 3. This charge is indicated by a hatched area in FIG. 3, noting that a portion 26 in FIG. 3 shows a defect in the n-type region.

With the aforementioned charge coupled device, when control voltage is applied to, for example, electrode 20D, a corresponding charge is stored in a transfer channel at a portion below the electrode 20D. At this time, the charge so stored is uniformly distributed in the channel-width direction in which it is transferred, as indicated by an arrow A in FIG. 1. Where a larger charge, for example, is transferred, a greater potential change occurs at a portion stored with the charge. In other words, an adequately larger drift field is locally self-induced in the transfer channel in which case the charge is moved at high speed in the transfer channel. On the other hand, if a smaller amount of charge is involved for transfer, a very weak electric field is self-induced in the transfer channel and thus the electric charge is moved in the transfer channel at a very slow speed corresponding to the thermal diffusion. That is, the speed with which the electric charge is transferred in the charged coupled device is slowed down due to a decrease in the amount of charge to be transferred. When the transfer speed needs to be set above a predetermined value, there is a possibility that an adequate dynamic range will not be obtained in the charge coupled device. Where a defect occurs in the transfer channel as at a portion in FIG. 3, a predetermined amount of charge is trapped as transfer loss for each transfer. The transfer inefficiency $\epsilon$ of the charge coupled device is represented by:

$$\epsilon = QT/QS$$

where
QT stands for the amount of charge trapped.
QS stands for the amount of charge to be transferred.

The transfer inefficiency is increased in proportion to the amount of charge to be trapped and in reverse proportion to the amount of charge to be transferred. When the charge is transferred as a signal, such trapping causes a lowering in the reliability of the device.

SUMMARY OF THE INVENTION

It is, accordingly, the object of this invention to provide a charge coupled device which can transfer even a small amount of charge at an adequately high speed with improved transfer efficiency.

According to this invention there is provided a charge coupled device comprising a semiconductor substrate of a first conductivity type, a channel region of a second conductivity type formed in the surface area of the substrate as a main transfer channel and extending in a first direction, a plurality of electrodes formed over and insulated from the main transfer channel and arranged in the first direction for receiving a control voltage sequentially to transfer charges in the main transfer channel, and potential control means for permitting a portion of the main transfer channel, a sub-transfer channel, to be set to a predetermined potential different from those of the other portions of the main transfer channel in a second direction perpendicular to the first direction.

According to this invention a different potential is set in the transfer channel in a channel-width direction perpendicular to that in which a charge is transferred. During transfer a small amount of charge is transferred along the sub-transfer channel, not along the whole width of the main transfer channel, decreasing the possibility of a portion of charge being trapped by a defect in the main transfer channel and thus assuring high transfer efficiency. Furthermore, a high electric field is self-induced since a charge is stored in the sub-transfer channel in the width direction. In consequence, the charge transfer speed of this invention is improved over that of a conventional charge coupled device.

DETAILED DESCRIPTION OF THE PREFERRED EMBODIMENT

A charge coupled device according to a first embodiment of this invention will be explained below with reference to FIGS. 4 and 5.

Figure 1:
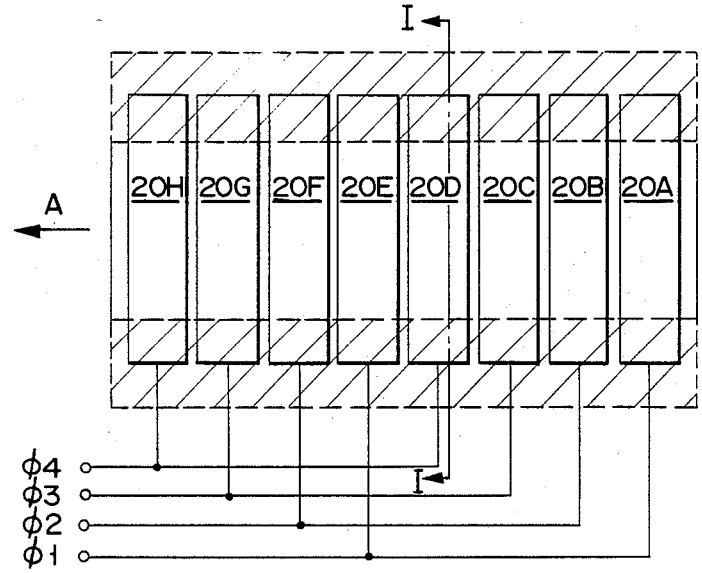
FIG. 1 is a plan view showing a conventional charge coupled device.
Figure 2:
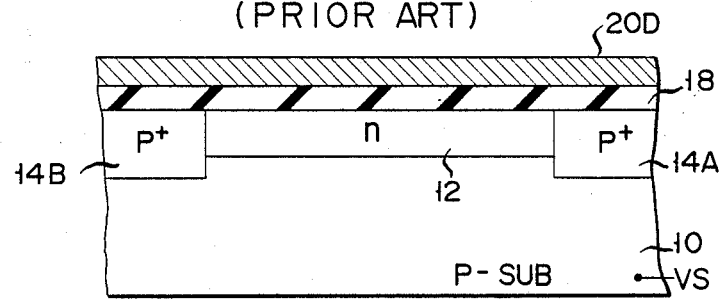
FIG. 2 is a cross-sectional view, as taken along line I—I in FIG. 1, showing the conventional charge coupled device.
Figure 3:
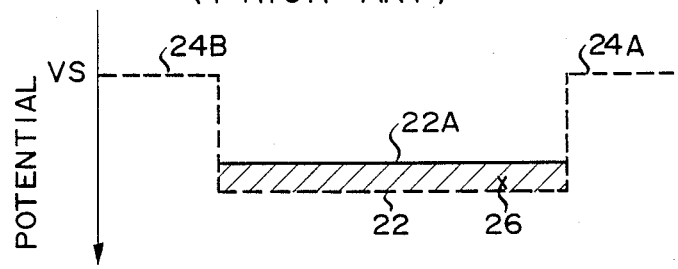
FIG. 3 is a view showing the operation principle of the charge coupled device of FIG. 1.
Figure 4:
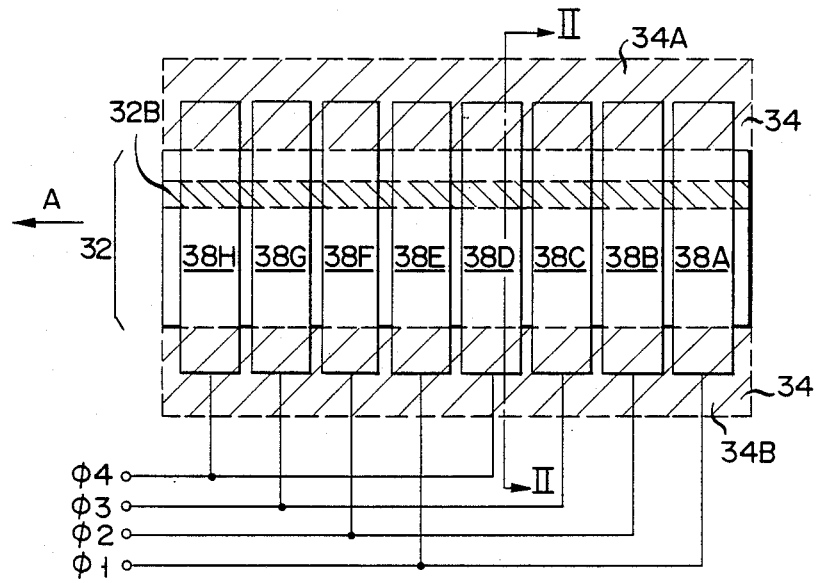
FIG. 4 is a plan view showing a charge coupled device according to a first embodiment of this invention.
Figure 5:
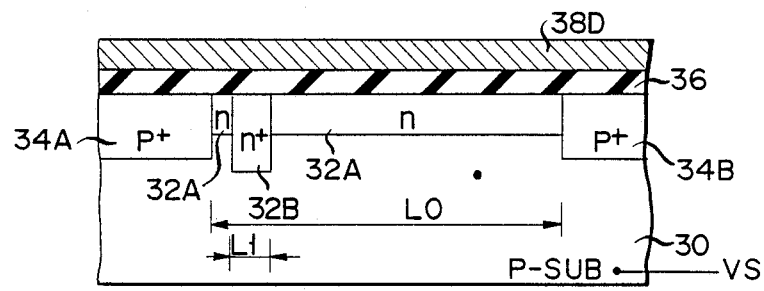
FIG. 5 is a cross-sectional view, as taken along line II—II in FIG. 4, showing the first embodiment.

FIG. 4 is a plan view of the first embodiment of this invention and FIG. 5 is a cross-sectional view as taken along line II—II in FIG. 4. The charge coupled device includes p-type silicon substrate 30, main transfer channel 32 and channel stopper 34. The channel stopper comprises p+-type regions 34A and 34B formed at a predetermined interval in the surface area of substrate 30. Transfer channel 32 is formed between p+-type regions 34A and 34B and includes n-type region 32A formed in contact with p+-type regions 34A and 34B, and at least one n+-type region 32B formed in n-type region 32A and in contact with substrate 30.

The n+-type region 32B has an impurity concentration higher in level than that of n-type region 32A and extends in the same direction as those of n-type region 32A and p+-type regions 34A and 34B. The charge coupled device includes insulating layer 36 overlying p+-type regions 34A and 34B, n-type region 32A and n+-type region 32B, as well as electrodes 38A, 38B, . . . formed on insulating layer 36. Electrodes 38A, 38B, . . . are arranged in the direction in which the transfer channel (i.e. the n— and n+-type regions 32A and 32B) extends. Electrodes 38A, 38B, . . . extend in a direction perpendicular to that of transfer channel 32 such that they overlay transfer channel 32. Electrodes 38A, 38B, . . . are selectively connected to terminals ($\phi$1, . . . $\phi$4) for receiving clock pulses of a predetermined phase difference as control voltages. That is, electrodes 38A, 38E, . . . are connected to terminal $\phi$1 and electrodes 38B, 38F, . . . are connected to terminal $\phi$2. Electrodes 38C and 38G are connected to terminal $\phi$3 and electrodes 38D and 38H are connected to terminal $\phi$4. Clock pulses are generated at an external 4-phase pulse generator, not shown, and supplied selectively through the corresponding terminal ($\phi$1, . . . and $\phi$4) to the corresponding electrodes (38A, 38E; 38B, 38F; . . . ; 38D, 38H). In FIG. 5, the symbol L0 represents the width of transfer channel 32 and symbol L1 represents the width of n+-type region 32B.

The charge coupled device will be explained below with reference to its charge transfer operation.

In this device, electrons (i.e., a majority carrier) are transferred, as charges, in transfer channel 32. Now suppose that the charge is stored in that portion of the transfer channel 32 below which, for example, electrode 38A is situated. The charge is moved into that portion of transfer channel 32, situated below electrode 38B, by supplying a clock pulse to electrode 38B. Immediately after the clock pulse has been supplied to electrode 38B, a potential on the transfer channel portion underlying electrode 38B is set to be higher in level than a potential on that transfer channel portion underlying electrode 38A, permitting the charge to be moved into that transfer channel portion below electrode 38B where the potential somewhat drops upon the receipt of the charge mentioned. The charge in the transfer channel portion below the electrode 38B is moved into that portion of the transfer channel, upon the supply of a corresponding clock pulse to electrode 38C, which underlies electrode 38C. If the corresponding clock pulses are sequentially supplied to the corresponding electrodes in this way, the charge is sequentially moved into the corresponding channel transfer portion below the corresponding electrode as indicated by arrow A in FIG. 4.

Figure 6:
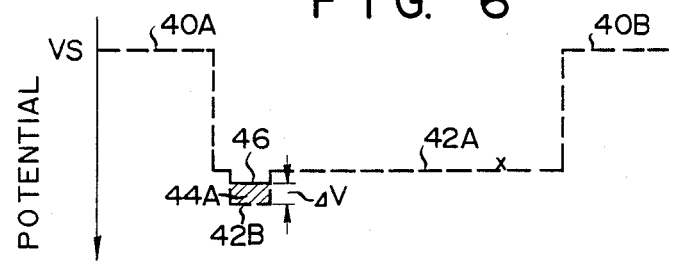
FIG. 6 shows a potential distribution when a small amount of charge is stored in the device.
Figure 7:
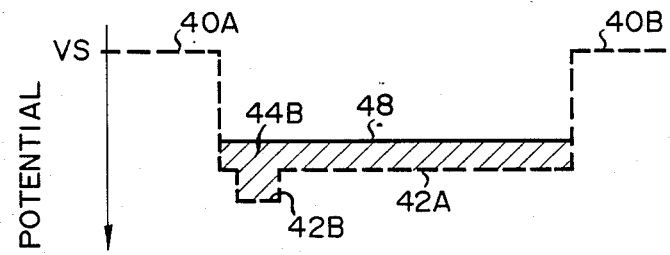
FIG. 7 shows a potential distribution when a greater amount of charge is stored in the device of FIG. 4.

FIGS. 6 and 7 show the potential distribution of the portion in the transfer channel under an electrode, for example, electrode 38D. When the clock pulse is supplied to electrode 38D, p+-type regions 34A and 34B, n-type region 32A and n+-type region 32B are set at their respective levels 40A, 40B, 42A, and 42B, as seen in FIG. 6. At this time, the potential of n+-type region 32B is set higher than that of the n-type region 32A due to the difference in impurity concentration level between the two. Consequently, a small amount of charge 44A, as shown in FIG. 6, is moved along n+-type region 32B in the main, which acts as a sub-transfer channel. In this case the potential of region 32B drops to level 46 indicated by the solid line in FIG. 6 where $\Delta V$ denotes the amount of potential variation. A greater amount of charge 44B, is supplied to n+-type region 32B for movement along n-type region 32A. In this case, the potentials of n— and n+-type regions 32A and 32B drops to level 48 as indicated by the solid line in FIG. 7.

In the aforementioned embodiment, the width of the transfer channel effectively varies in accordance with the amount of charge to be transferred. In the small-charge transfer mode the charge is transferred through the utilization of the sub-transfer channel, not through the entire transfer channel, as viewed in a width-direction of the transfer channel. That is, a small amount of charge is moved along n+-type region 32B in the direction of arrow A in FIG. 4, in which case potential variation $\Delta V$ as shown in FIG. 6 is greater than in the absence of n+-type region 32B. This causes a sufficiently great drift field to be self-induced in the transfer channel 32. As a result, the time in which the small amount of charge is completely moved from the transfer channel portion below one electrode into the transfer channel portion below the adjacent electrode is reduced in comparison with the time required in the conventional device. Now consider the case where the charge coupled device has the defect indicated by the mark x in FIG. 6. When the amount QS of charge to be transferred is small, it is done along n+-type region 32B and the charge is not trapped in the defect. When, on the other hand, the amount QS of charge to be transferred is greater, it is done along n-type region 32A and n+-type region 32B in which case a certain amount QT of charge is trapped at the defect. However, the whole amount QS of charge is sufficiently greater than the amount QT of charge trapped at the defect spot. This reduces transfer inefficiency QT/QS. According to the embodiment, it is possible to reduce the adverse effect of the aforementioned defect upon the charge transfer and thus to greatly improve transfer efficiency.

Figure 8:
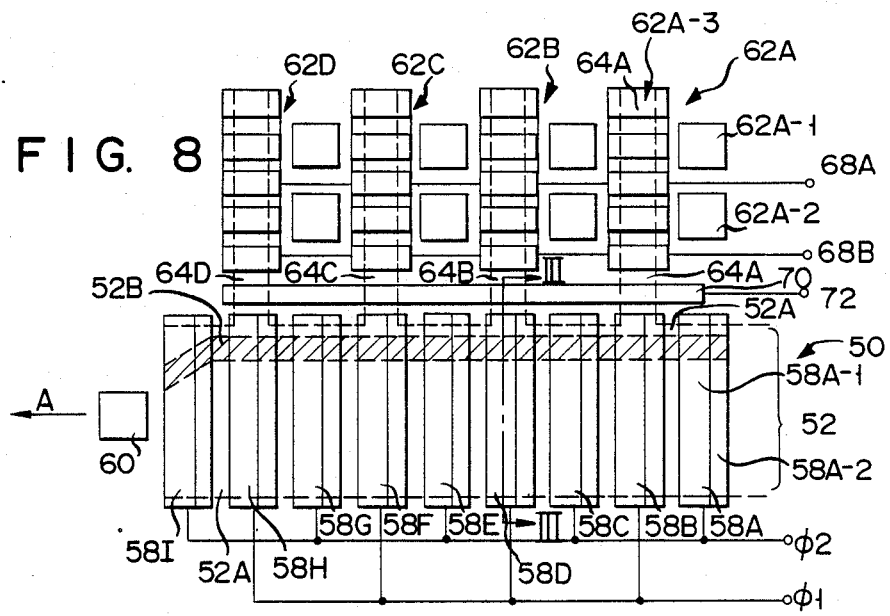
FIG. 8 is a plan view showing a solid-state image sensing device according to a second embodiment of this invention.
Figure 9:
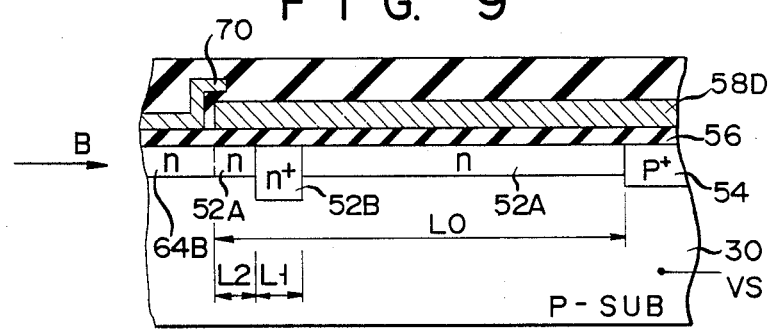
FIG. 9 is a cross-sectional view as taken along line III—III in FIG. 8 showing the second embodiment.

A solid-state image sensing device according to this invention which includes charge coupled device (CCD) 50 similar to the aforementioned embodiment will be explained below with reference to FIGS. 8 to 10. FIG. 8 is a plan view showing a solid-state image sensing device; FIG. 9 is a cross-sectional view along line III—III in FIG. 8; and FIG. 10 shows a potential distribution in the cross-section of FIG. 9.

The solid-state image sensing device has transfer channel 52 and p+-type region 54 as a channel stopper in the surface area of a p-type silicon substrate 30. Transfer channel 52 includes n-type region 52A in contact with p+-type region 54 and n+-type region 52B formed in n-type region 52A and in contact with substrate 30. n+-type region 52B has an impurity concentration higher in level than n-type region 52A and extends in the same direction as that of n-type region 52A. The solid-state image sensing device further includes insulating layer 56, overlying p+-type region 54, n-type region 52A, and n+-type region 52B as well as electrodes 58A, 58B, ... formed on insulating layer 56. The electrodes are arranged in the direction in which transfer channel 52 extends. Electrodes 58A, 58B, ... extend in a direction perpendicular to that in which transfer channel 52 extends, and are situated above transfer channel 52. Electrodes 58A, 58B, ... are selectively connected to terminals $\phi 1$ and $\phi 2$ for receiving clock pulses of a predetermined phase difference as control voltages. That is, electrodes 58B, 58D, 58F, and 58H are connected to terminal $\phi 1$ and electrodes 58A, 58C, 58E, 58G and 58I are connected to terminal $\phi 2$. The clock pulses are generated by, for example, an external two-phase clock generator, not shown, and sequentially supplied to electrodes 58A, ..., 58I selectively through the terminal ($\phi 1$, $\phi 2$). Each of the electrodes (58A, ..., 58I), for example electrode 58A, has a control section 58A-1 for controlling the charge storage and stopper section 58A-2 for preventing overrunning of the charge. The solid-state image sensing device has output circuit 60 in the neighborhood of the electrode 58I which receives a charge from transfer channel 52 to generate a voltage corresponding to the amount of charge received. n+-type region 52B extends down toward the output circuit 60. The solid-state image sensing device includes photoelectric converting elements 62A-1, 62A-2, ... and vertical CCDs 62A, 62B, 62C and 62D for transferring charges supplied from photoelectric converting elements 62A-1, 62A-1, ... CCDs 62A to 62D respectively, have n-type regions 64A, 64B, 64C, and 64D formed in the surface area of substrate 30 in contact with transfer channel 52. CCDs 62A to 62D receive two-phase pulses from terminals 68A and 68B to transfer the charge to transfer channel 52 in CCD 50. Electrode 70, as shown in FIG. 8, is insulated from and formed over n-type regions 64A, 64B, ... of CCDs 62A, 62B, 62C and 62D and permits the charges to be supplied from CCDs 62A, 62B, 62C and 62D to transfer channel 52 in response to the control signal supplied through terminal 72. In FIG. 9, L0 indicates the width of the transfer channel; L1 indicates the width of n+-type region 52B and L2 indicates the distance between the n-type region 64B underneath electrode 70 and n+-type region 52B.

Figure 10:
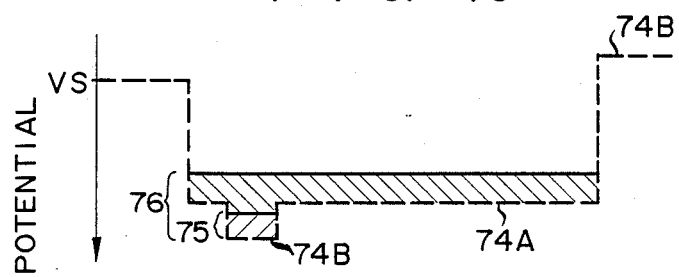
FIG. 10 shows a potential distribution in the cross-section of FIG. 9.

In FIG. 10, 74A shows the potential of n-type region 52A, and 74B shows the potential of n+-type region 52B. In this device, when a small amount of charge 75 is supplied from each CCD (62A to 62D) into transfer channel 52, it is stored in n+-type region 52B and transferred along n+-type region 52B in the direction indicated by arrow A in FIG. 8. When a greater amount of charge 76 is supplied, it is stored in n+-type region 52B and n-type region 52A and transferred along regions 52A and 52B. In this connection it is to be noted that, when the charge is supplied from a CCD, for example photosensing CCD 62B, into the transfer channel 52, it always moves in transfer channel 52 in the direction indicated by arrow B in FIG. 9 and stored in n+-type region 52B. The possibility with which the charge will be trapped at the defect while being moved is increased in proportion to distance L2. For this reason it is important that distance L2 be reduced by positioning n+-type region 52B as close to the photosensing section (62A, ..., 62D) as possible.

Figure 11:
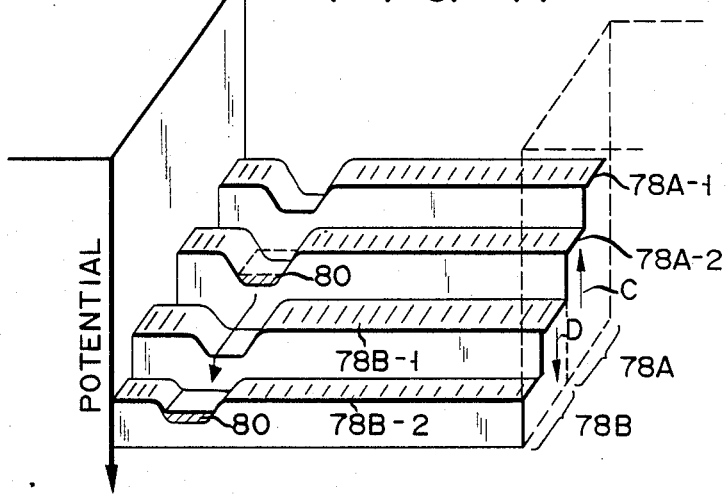
FIG. 11 shows the manner in which a small amount of charge is transferred in the solid-state image sensing device of FIG. 8.

FIG. 11 shows the manner in which a small amount of charge is transferred in transfer channel 52. In FIG. 11, 78A and 78B show the potential of those portions of the transfer channel 52 underlying, for example, electrodes 58D and 58E respectively. Potentials 78A-1 and 78B-1 correspond to the potential of those portions underlying the stopper section electrodes 58D and 58E. Potentials 78A-2 and 78B-2 correspond to the potential of those portions underlying the control sections of electrodes 58D and 58E. When the small amount of charge, 80, is supplied into transfer channel 52 underlying electrode 58D while a clock pulse is being supplied to this electrode, it is stored in n+-type region 52B underlying the control section of electrode 58D. If in this state the clock pulse to the electrode 58D falls and the clock pulse to the adjacent electrode 58E rises, the potential of those channel portions underlying electrodes 58D and 58E will vary in the directions indicated by arrows C and D in FIG. 11. When the potential of 78B becomes higher than the potential of 78A, charge 80 is moved along n+-type region 52B from a position underlying the control section of the electrode 58D to a position underlying the control section of electrode 58E. Where a greater amount of charge, not shown, is supplied to transfer channel 52, the charge is moved along not only n+-type region 52B but also n-type region 52A.

According to this embodiment, transfer channel 52 can receive charges from the photosensing sections (62A, ..., 62D), Where the charge is relatively smaller in amount, it is transferred mainly along n+-region 52B. For this reason, the charge is transferred at high speeds as in the case of the preceding embodiment and at the same time there is a small possibility that the charge will be trapped during transfer.

It is desirable that width L1 of $n^+$-type region 32B or 52B in the first and second embodiments be equal to, or smaller, than one half of width L0 of transfer channel 32 or 52.

Although in the first and second embodiments the transfer channel (32, 52) has a single $n^+$-type region (32B, 52B), a plurality of $n^+$-type regions may be provided in transfer channels 32 or 52 for charge transfer. In this case it is possible to obtain the same advantage as in the aforementioned embodiments, noting that the $n^+$-type regions may differ in their impurity concentration levels.

Although in the second embodiment employs vertical CCDs and photoelectric converting element, they may be replaced by providing charge storages having a photoelectric converting function.

Figure 12:
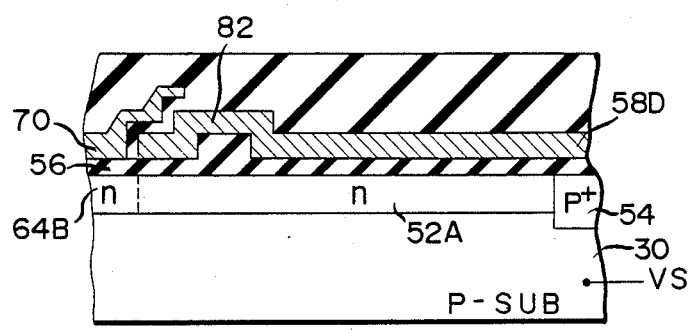
FIG. 12 is an explanatory view for explaining a cross-sectional structure of a solid-state image sensing device according to a third embodiment of this invention.

FIG. 12 explains the arrangement of a solid-state image sensing device according to a third embodiment of this invention. In this embodiment, a portion of the device described in FIG. 9 is modified. The device does not include $n^+$-type region 52B shown in FIG. 9. Instead, an insulating layer 56 has a thick portion formed on the n-type region 52A at a position corresponding to the region 52B. All of the electrodes, for example electrode 58D, are formed on this insulating layer 56. When a clock pulse is supplied to electrode 58D, the potential of n-type region 52A is set to be relatively high in level below portion 82 of electrode 58D. This embodiment can realize the same advantage as the embodiment where the $n^+$-type layer 52B is formed in n-type layer 52A with the impurity concentration in transfer channel 52 kept at a predetermined level.

Figure 13:
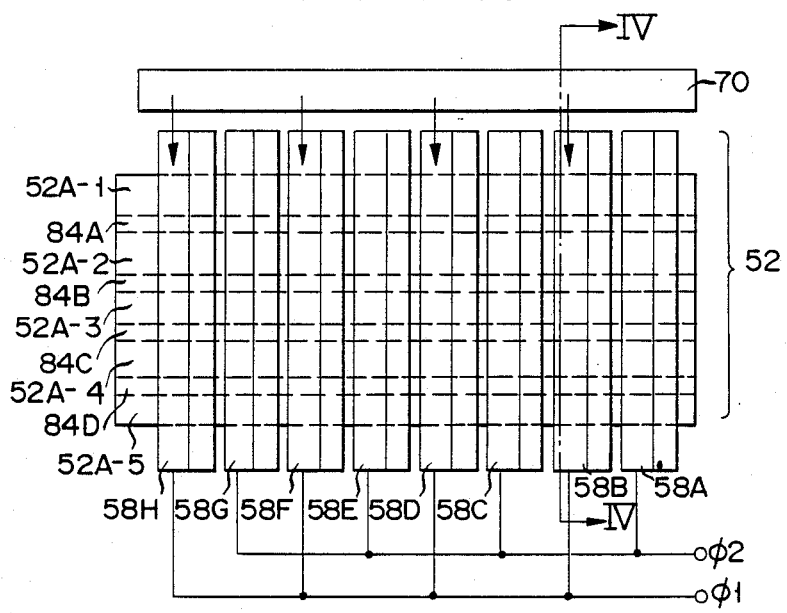
FIG. 13 is a plan view showing a charge coupled device according to a fourth embodiment of this invention.
Figure 14:
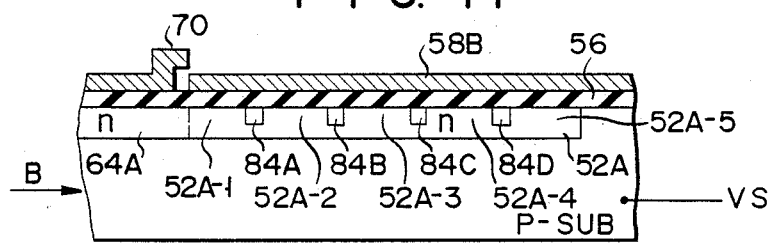
FIG. 14 is a view as taken along IV—IV in FIG. 13 showing the fourth embodiment.

A charge coupled device according to a fourth embodiment of this invention will be explained below with reference to FIGS. 13 to 14. FIG. 13 is a plan view showing this charge coupled device. FIG. 14 is a cross-sectional view as taken along line IV—IV in FIG. 13. This device is similar to the device shown in FIGS. 8 and 9 except for the following arrangement. The device shown in FIGS. 13 and 14 does not include the $n^+$-type region 52B shown in FIG. 9. Instead, $p^-$-type electric barrier regions 84A to 84D are formed as an electric barrier in the surface area of an n-type region 52A. The $p^-$-type electric barrier regions, 84A to 84D are arranged in the direction in which transfer channel 52 extends and have the same impurity concentration level. The n-type region, 52A, includes the first to fifth subchannels, 52A-1 to 52A-5, separated by $p^-$-type electric barrier regions 84A to 84D.

Figure 15:
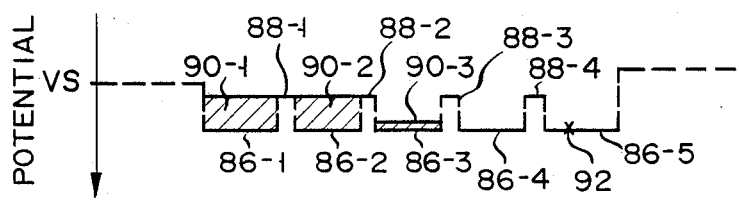
FIG. 15 shows a potential distribution in the cross-section in FIG. 14.

FIG. 15 shows potential distribution in the transfer channel portion below each of the electrodes, for example electrode 58B, when a clock pulse is supplied to the electrode. In FIG. 15, reference numerals 86-1 to 86-5 represent the potential of subchannels 52A-1, ..., 52A-5, respectively, when no charge is stored there, and reference numerals 88-1, ..., 88-4 represent the potential of the n-type electric barrier region 52A under $p^-$-regions 84A, ..., 84D, respectively. For example, when a certain amount of charge is supplied in the direction indicated by B in FIG. 14 into transfer channel 52, it is stored as charge portion 90-1 in subchannel 52A-1. The potential of subchannel 52A-1 falls to a potential equal to potential 88-1. Another charge portion 90-2 is injected into the subchannel 52A-2 and the potential of subchannel 52A-2 falls to a potential equal to potential 88-2. Another charge portion, 90-3, is injected into subchannel 52A-3. If, in this way, additional charge portions are injected into subsequent subchannels 52A-4 and 52A-5, they are stored in corresponding subchannels 52A-4 and 52A-5.

In this embodiment the charge portions are sequentially stored in subchannels 52A-1, ..., 52A-5 according to their charge amounts in comparison with the case where a charge is stored along all of transfer channel 52. If in this case a charge portion small enough to be stored completely in the subchannel 52A-1, it is not injected in the subsequent subchannels 52A-2, ..., 52A-5. Even if a defect, such as indicated by 92 in FIG. 15, is present in any one of the subsequent subchannels 52A-2 to 52A-5, no charge portion is trapped by such a defect. Although, a defect may be present in subchannel 52A-1, there is still an advantage in that all negative influence resulting from the defects in subsequent subchannels 52A-2, ..., 52A-5 can be eliminated. In conventional devices where defects are present, for example, in the first and fifth subchannels 52A-1 and 52A-5, portions of the supplied charge are trapped in the respective spots in the conventional charge coupled device. According to this embodiment in contrast, such a portion of the supplied charge is trapped only at the defect in subchannel 52A-1, assuring higher transfer efficiency than in conventional devices.

When a greater amount of charge is supplied into transfer channel 52, it may be stored in the entire transfer channel (i.e. subchannels 52A-1, ..., 52A-5). In this case, the amount of charge trapped as at a defect can be regarded as being sufficiently small compared with the amount of charge stored in all of transfer channel 52.

Figure 16:
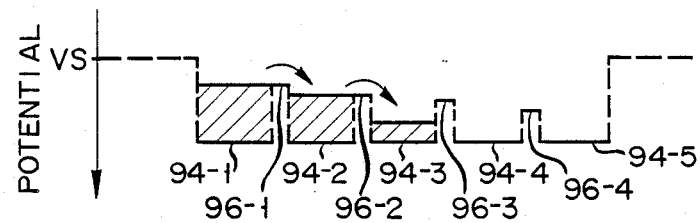
FIG. 16 is an explanatory view for explaining a charge coupled device according to a fifth embodiment of this invention, the device being identical to the device of FIG. 13 except that an impurity concentration level in the transfer channel differs.

In the fifth embodiment of this invention, the $p^-$-type electric barriers regions 84A, ..., 84D of the device of FIG. 13 differ in their impurity concentration levels. In this embodiment $p^-$-type electric barrier region 84A is highest in its impurity concentration level and the subsequent $p^-$-type electric barrier regions 84A, ..., 84D are lower in impurity concentration level than regions 84A, ..., 84C, respectively. While a clock pulse is supplied to, for example, electrode 58B the potential of transfer channel 52 underlying electrode 58B have a distribution as shown in FIG. 16. In FIG. 16, reference numerals 94-1, ..., 94-5 represent the potential of subchannels 52A-1, ..., 52A-5 and reference numerals 96-1, ..., 96-5 represent the potential of the n-type region 52A under $p^-$-type electric barrier regions 84A, ..., 84D. In this device the potential of 96-2, 96-3 and 96-4 are set to be lower than the potential of 96-1, 96-2 and 96-3, respectively. When the charge is moved from subchannel 52A-1 to subchannel 52A-5, it is relatively smooth.

Figure 17:
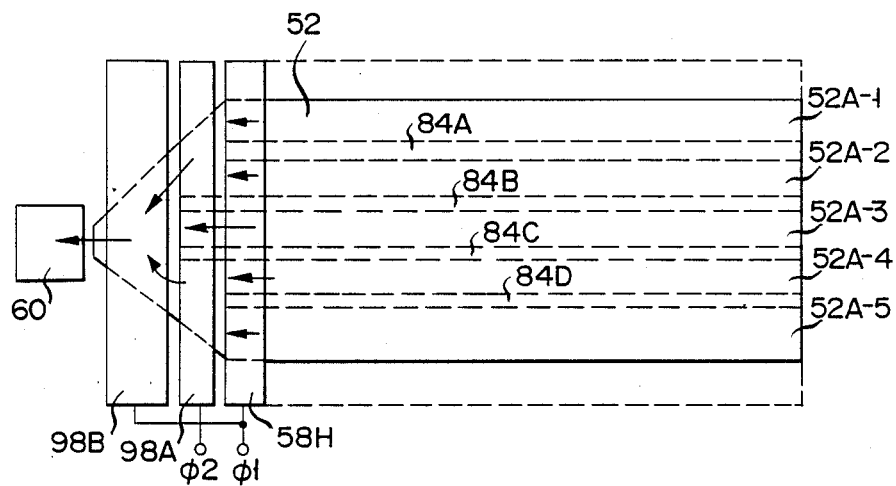
FIG. 17 is a view showing a charge transfer device including the device of FIG. 13 and an additional output circuit.

FIG. 17 shows the arrangement of transfer channel 52 of a charge coupled device with output circuit 60 added thereto as shown in FIG. 8, in which electrodes 98A and 98B are formed between output circuit 60 and electrode 58H. n-type region 52A is formed to converge toward output circuit 60 in positions below electrodes 98A and 98B. The ends of $p^-$-type electric barrier regions 84A and 84D are situated below electrode 58H and the ends of $p^-$-type regions 84B and 84C are situated below electrode 98A. In this arrangement, the charge is separately transferred below electrodes 58A to 58H and then combined below the electrodes 98A and 98B to be supplied to output circuit 60.

In the aforementioned embodiment, n-type region 52A is formed in the surface area of p-type silicon substrate 30 and p⁻-type electric barrier region 84A, ..., 84D are formed in the surface area of n-type region 52A.

Even if, in the aforementioned embodiment, the semiconductor regions are opposite in polarity to those shown above, it is still possible to obtain the same advantages as described in the aforementioned embodiments.

What is claimed is:

1. A charge coupled device comprising:
 a semiconductor substrate of a first conductivity type;
 a channel region of a second conductivity type formed in a surface area of said semiconductor substrate, extending in one direction and serving as a transfer channel;
 charge supplying means, substantially adjacent to said channel region in the lateral direction of said channel region, for supplying charge to said channel region;
 electrode means insulated from said channel region, for applying a control voltage to said channel region to transfer charge through said channel region; and
 potential control means for efficiently transferring small amounts of charge through at least one subregion of said channel region while transferring large amounts of charge through the entire channel region, including a plurality of electrical barrier regions formed in said channel region extending in said one direction substantially throughout said transfer channel and containing an impurity of the first conductivity type, the impurity concentration of each of said electrical barrier regions being inversely proportional to the distance between it and said charge supplying means and the electrostatic potential energy of each of said electrical barrier regions being set at a level higher than that of said transfer channel and lower than that of said substrate outside of said transfer channel when said control voltage is applied thereto.

2. The charge coupled device according to claim 1, further comprising an output circuit to which the charge transferred through said channel region is supplied.

3. The charge coupled device according to claim 2, wherein said channel region has an end portion with a gradually narrowed width toward said output circuit.

4. A charge coupled device according to claim 3, wherein said electrical barrier regions have different lengths to cause the transferred charge to be gradually combined at said end portion of said channel region.

5. The charge coupled device according to claim 1, wherein said charge supplying means includes a plurality of photoelectric converting elements and transfer means for transferring charge from said photoelectric converting elements to said channel region.

6. A charge coupled device according to claim 1, wherein said electrical barrier regions are of the first conductivity type.

7. A charge coupled device comprising:
 a semiconductor substrate of a first conductivity type;
 a channel region of a second conductivity type formed in a surface area of said semiconductor substrate, extending in one direction and serving as a transfer channel;
 charge supplying means substantially adjacent to said channel region in the lateral direction of said channel region, for supplying charge to said channel region;
 electrode means insulated from said channel region, for applying a control voltage to said channel region to transfer charge through said channel region;
 potential control means for efficiently transferring small amounts of charge through at least one subregion of said channel region while transferring large amounts of charge through the entire channel region, including a plurality of electrical barrier regions formed in said channel region extending in said one direction substantially throughout said transfer channel and containing an impurity of the first conductivity type, the electrostatic potential energy of each of said electrical barrier regions being set at a level higher than that of said transfer channel and lower than that of said substrate outside of said transfer channel when said control voltage is applied thereto; and
 an output circuit to which the charge transferred through said channel region is supplied;
 wherein said electrical barrier regions have different lengths to cause the transferred charge to be gradually combined at an end portion of said channel region.

8. A charge coupled device according to claim 7, wherein said end portion of said channel region has a gradually narrowed width toward said output circuit.

* * * * *